(12) United States Patent
Noda

(10) Patent No.: US 7,330,451 B2
(45) Date of Patent: Feb. 12, 2008

(54) CODE DIVISION MULTIPLE ACCESS COMMUNICATION SYSTEM AND METHOD

(75) Inventor: Seiichi Noda, Tokyo (JP)

(73) Assignee: NEC Corporation, Tokyo (JP)

( * ) Notice: Subject to any disclaimer, the term of this patent is extended or adjusted under 35 U.S.C. 154(b) by 996 days.

(21) Appl. No.: 10/337,295

(22) Filed: Jan. 7, 2003

(65) Prior Publication Data

US 2004/0085937 A1 May 6, 2004

(30) Foreign Application Priority Data

Jan. 11, 2002 (JP) .............................. 2002-005405

(51) Int. Cl.
*H04B 7/216* (2006.01)

(52) U.S. Cl. ...................... 370/335; 370/320; 370/342; 455/42; 455/23; 455/337

(58) Field of Classification Search ................ 370/335, 370/320, 342, 441, 479, 204, 215, 483; 375/130, 375/140; 455/21, 42, 23, 102, 106, 108, 455/110, 205, 337
See application file for complete search history.

(56) References Cited

U.S. PATENT DOCUMENTS

| | | | |
|---|---|---|---|
| 3,866,147 A * | 2/1975 | De Couvreur et al. ........ 341/57 |
| 4,961,192 A | 10/1990 | Grimes | |
| 5,257,270 A * | 10/1993 | Hilden et al. ................ 714/781 |
| 5,394,250 A * | 2/1995 | Shono ....................... 358/3.03 |
| 5,761,239 A * | 6/1998 | Gold et al. .................. 375/150 |
| 5,790,591 A * | 8/1998 | Gold et al. .................. 375/142 |
| 6,215,813 B1 | 4/2001 | Jones et al. | |

FOREIGN PATENT DOCUMENTS

| | | |
|---|---|---|
| JP | 53-147454 | 12/1978 |
| JP | 3-109646 | 9/1991 |
| JP | 04-196945 | 7/1992 |
| JP | 2000-278245 | 10/2000 |
| JP | 2003-60721 | 2/2003 |
| JP | 2003-60724 | 2/2003 |

OTHER PUBLICATIONS

Kota Kinoshita, "Simple IMT-2000", Chapter 5, Published by the Electrical Communications Society, 2001.
Kota Kinoshita, "Simple IMT-2000", Published by the Electrical Communications Society, 2001.

(Continued)

*Primary Examiner*—Jean Gelin
*Assistant Examiner*—Huy D Nguyen
(74) *Attorney, Agent, or Firm*—McGinn IP Law Group, PLLC

(57) ABSTRACT

Disclosed is a CDMA communication system and method that make it possible to accommodate a greater number of user terminals that can be connected per facilities investment. Ternary phase-shift keying (TPSK) modulation is applied as primary modulation in a CDMA communication system. It is possible to deliver far performance in which the $E_b/N_o$ ratio is improved by about 0.75 dB, in comparison with BPSK and QPSK modulation, in order to obtain the required signal quality. Accordingly, the number of user terminals that can be connected simultaneously in a CDMA system can be increased by about 19%.

10 Claims, 7 Drawing Sheets

OTHER PUBLICATIONS

R. Lucky, et al., Translated by Hoshiko, et al., "Principles of Data Communication", Lattice Publications, 1973.

Marubayashi, Nakagawa and Kono, "Spread-Spectrum Communications and Applicaitons", Edited by the Electronics Information Communicaitons Society, 1998.

ISITA (International Symposium on Information Theory and Applications), "Performance and Application of PSK Modulation Whose Number of Phases is not a Power of 2", Oct. 7-11, 2002, pp. 239-242.

European Search Report dated Apr. 22, 2003.

Bernie Sayrac et al., "Design and Evaluation of Two Block Coded Modulation Schemes", Electrotechnical Conference, 1994, Proceedings, 7th Mediterranean Antalya, Turkey 12-14, New York, NY, USA, IEEE, pp. 215-218.

H.G. Jardak et al., "Concatenated codes using multilevel structures for PSK signalling over the Rayleigh fading channel", IEE Proc.-Commun., vol. 141, No. 4, Aug. 1994, pp. 233-236.

Daniel J. Costello, Jr., et al., "Applications of Error-Control Coding", IEEE Transactions on Information Theory, vol. 44, No. 6, Oct. 1998, pp. 2531-2560.

European Search Report dated Aug. 9, 2004.

Seiichi Noda, et al., "Performance and Applications of PSK Modulation whose number of phases is not a power of 2", International symposium on Information Theory and Its Applications, Xi'an, PRC, Oct. 7-11, 2002.

W. Peterson, et al., "Error-correcting Codes", Second Edition MIT Press 1972, pp. 269-275.

Japanese Office action dated Jul. 31, 2006 with partial English translation.

* cited by examiner

FIG. 2a
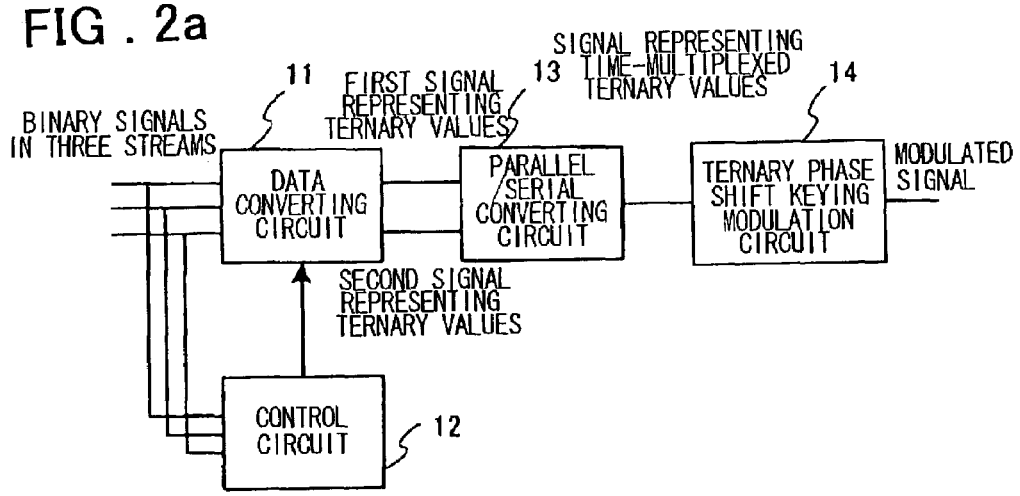
FIG. 2b
| INPUT | OUTPUT |
|-------|--------|
| 000   | 00     |
| 001   | 01     |
| 010   | 02     |
| 011   | 10     |
| 100   | 11     |
| 101   | 12     |
| 110   | 20     |
| 111   | 21     |
FIG. 2c
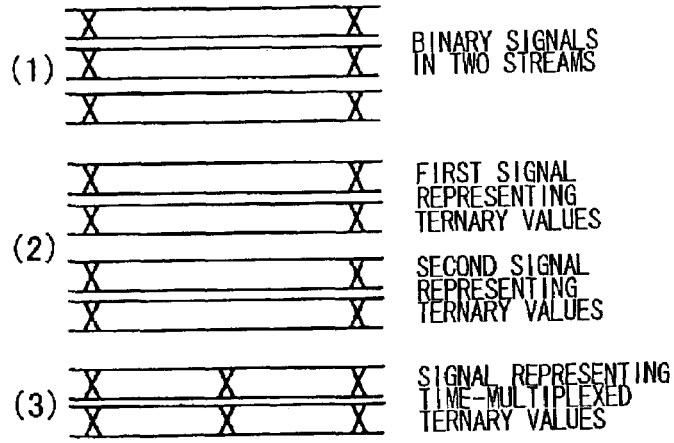
FIG. 2d
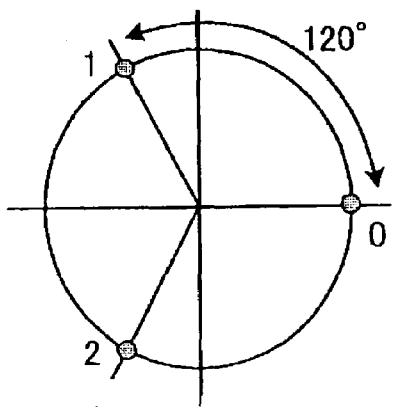

FIG. 3

| MODULATION METHOD | NUMBER OF PHASES M | REQUIRED C/N (RELATIVE RATIO) $1/\sin^2(\pi/M)$ | bit/Symbol $\log_2 M$ | REQUIRED Eb/No (RELATIVE RATIO) $1/\sin^2(\pi/M)/\log_2 M$ |
|---|---|---|---|---|
| BPSK | 2 | 1.000 ⟨0dB⟩ | 1.000 ⟨0dB⟩ | 1 ⟨0dB⟩ |
| TPSK | 3 | 1.333 ⟨1.25dB⟩ | 1.585 ⟨2.00dB⟩ | 0.841 ⟨-0.75dB⟩ |
| QPSK | 4 | 2.000 ⟨3.01dB⟩ | 2.000 ⟨3.01dB⟩ | 1 ⟨0dB⟩ |
| 8PSK | 8 | 6.828 ⟨8.34dB⟩ | 3.000 ⟨4.77dB⟩ | 2.276 ⟨3.57dB⟩ |

NOTE: 8PSK: 8 Phase Shift Keying, TPSK: Ternary Phase Shift Keying,
QPSK: Quadrature Phase Shift Keying,
⟨ ⟩: REPRESENTS DECIBELS

CODE DIVISION MULTIPLE ACCESS COMMUNICATION SYSTEM AND METHOD

FIELD OF THE INVENTION

This invention relates to code division multiple access communications and, more particularly, to a code division multiple access communication system and method that adopt primary modulation of a carrier by transmit information (information modulation, narrow-band modulation or data modulation) and secondary modulation (or spreading modulation) for spreading the information modulation.

BACKGROUND OF THE INVENTION

Code division multiple access (CDMA) communication system is adopted in second-generation mobile communication systems such as IS-95, in third-generation mobile communication systems such as IMT-2000, and in wireless LANs. Generally, in conventional CDMA communication system, binary phase-shift keying (BPSK) or quaternary (quadrature) phase-shift keying (QPSK) is utilized as primary modulation.

FIG. 6 is a block diagram illustrating the structure of modulator/demodulator of CDMA communication system utilized in third-generation mobile communications as a conventional technique. The modulator/demodulator is one well known to those skilled in the art, e.g., in case of IMT-2000 illustrated in "Simple IMT-2000" by Kota Kinoshita (Chapter 5, published by the Electrical Communications Society, 2001). QPSK(Quaternary Phase-Shift Keying) is used as a primary modulation in a downlink and BPSK(Binary Phase-Shift Keying) as primary modulation in an uplink.

On a transmit side, primary modulation of a carrier signal by transmit information is carried out by a modulator 1A that performs BPSK or QPSK, the BPSK- or QPSK-modulated signal is spread-spectrum modulated (subjected to secondary modulation) with a spreading code by a spreader 2A, which outputs the spread-spectrum modulated signal as a transmit signal. On a receive side, the spread-spectrum modulated signal is supplied as a received signal to a despreader 3A which despreads the received signal with a spreading code to output the BPSK- or QPSK-modulated signal, and the BPSK- or QPSK-modulated signal is demodulated by a demodulator 4A, which outputs the demodulated signal as received information.

FIG. 7 is a system block diagram illustrating the principles of IMT-2000 DS-CDMA ["Simple IMT-2000" by Kota Kinoshita (published by the Electrical Communications Society, 2001)]. In application of error-correcting encoding as channel encoding, use is made of convolutional code and turbo code is applied in case of high-speed data. A narrow-band modulator 1B employs QPSK in the downlink and BPSK in the uplink. FIG. 7 illustrates the uplink from a user terminal. At the user terminal, transmit data is modulated by a BPSK modulator 1B, the spectrum of the modulated signal is spread with a specific spreading code by a spreader 2B, the spread-spectrum signal is converted to radio frequency by a frequency converting circuit 7B, and the resultant signal is transmitted from an antenna as a wide-band radio signal. On the receive side, a wide-band radio signal is received from each user terminal, the received signal is despread with a spreading code of each user terminal via a frequency converting circuit 8B and filter, each signal is demodulated by a narrow-band demodulator 4B, and the resultant signal is output as received data.

SUMMARY OF THE DISCLOSURE

Construction cost for a base station used in mobile communications is very high. For this reason, there is demand for a CDMA communication system that is capable of accommodating a greater number of user terminals connectable simultaneously to one base station. Such a system makes it possible to earn greater revenues for the same equipment costs.

As the primary modulation, however, conventional CDMA communication system adopt BPSK and QPSK, which have a superior Eb/No ratio (ratio of energy Eb per signal bit to noise-power spectrum density No), as multi-phase shift keying modulation in which the number of phases is a power of 2 in the conventional technique. Since the number of user terminals connectable simultaneously to one base station is approximately proportional to the reciprocal of Eb/No, a problem which arises is that the upper limit on the number of users is restricted to a numerical value that corresponds to BPSK and QPSK.

Accordingly, it is an object of the present invention to provide a code division multiple access communication system and method in which a greater number of user terminals can be connected simultaneously.

Another object of the present invention is to provide a code division multiple access communication system and method in which a large number of user terminals can be connected simultaneously by virtue of superior performance in terms of a value of Eb/No that affords the necessary signal quality.

According to the present invention, the foregoing objects are attained by providing a system in which ternary phase-shift keying modulation is applied in a primary modulation portion in code division multiple access communication system.

More specifically, a code division multiple access communication system according to the present invention is so adapted that ternary phase-shift keying modulation is adopted as primary modulation by a data signal.

Preferably, ternary error-correcting encoding is applied to the data signal.

Further, a modulating apparatus, according to the present invention, for use in a code division multiple access communication system, comprises a ternary phase-shift keying modulator for modulating a data signal, and a spreader for spreading an output of the ternary phase-shift keying modulator with a spreading code.

Preferably, the modulating apparatus further comprises a ternary error-correcting encoding circuit for applying ternary error-correcting encoding to the data signal.

Further, a demodulating apparatus, according to the present invention, for use in a code division multiple access communication system, comprises a despreader for performing spectrum despreading of a received signal, and a ternary phase-shift keying demodulator for demodulating an output of the despreader.

Preferably, the demodulating apparatus further comprises an error-correcting decoding circuit for subjecting a data signal to ternary error-correcting decoding.

The present invention further provides a communication method in a code division multiple access communication system in which use is made of ternary phase-shift keying as primary modulation by a data signal.

Preferably, ternary error-correcting encoding is applied to the data signal.

In operation, a ternary phase-shift keying modulator/demodulator is provided for primary modulation in a code division multiple access communication system. As a result, in comparison with BPSK and QPSK modulation, it is possible to deliver far better performance in the Eb/No ratio in order to obtain the signal quality required. This makes it possible to increase greatly the number of user terminals that can be connected simultaneously. With the code division multiple access communication system according to the present invention, the number of user terminals that can be connected simultaneously can be increased a little less than 20% in comparison with the conventional system that relies upon BPSK and QPSK.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 is a diagram illustrating a TPSK modulator according to this embodiment as well as the functions thereof;

FIG. 3 is a table illustrating necessary C/N, number of transmission bits per symbol and values of necessary Eb/No classified by number of phases in multi-phase shift keying;

DESCRIPTION OF THE PREFERRED EMBODIMENTS

Preferred embodiments of the present invention will now be described in detail with reference to the accompanying drawings.

Figure 1:
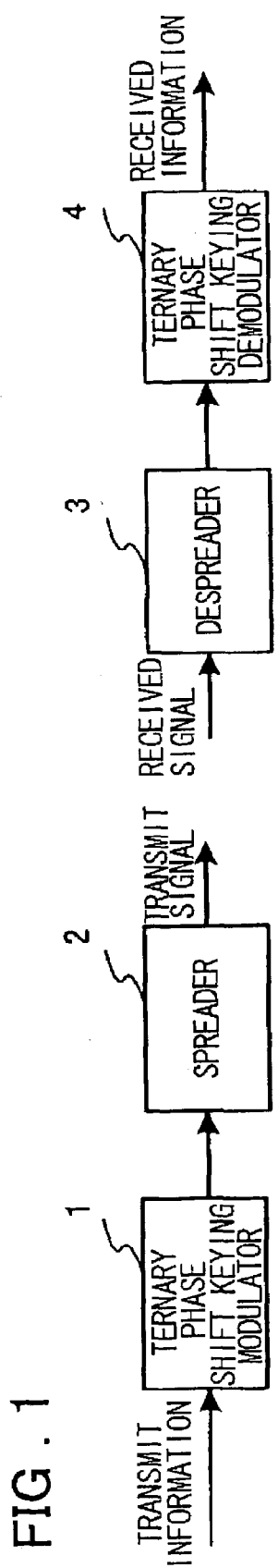
FIG. 1 is a block diagram illustrating an embodiment of a CDMA communication system and method according to the present invention.

FIG. 1 is a block diagram illustrating an embodiment of a CDMA communication system and method according to the present invention. The transceiver section in the CDMA communication system according to this embodiment comprises a modulating apparatus on the transmit side and a demodulating apparatus on the receive side. The modulating apparatus comprises a ternary phase shift keying modulator 1 for receiving digital transmit information (a data signal) as a modulating signal, and performing ternary phase-shift keying of a carrier signal by the data signal, and a spreader 2 for performing spectrum spreading of the output of the ternary phase shift keying modulator 1 with a prescribed spreading code to obtain a transmit signal. The demodulating apparatus on the receive side comprises a despreader 3 for receiving the transmit signal as a received signal and performing spectrum despreading of the received signal with a spreading code to thereby generate and output a ternary phase shift keying modulated signal, and a ternary phase shift keying demodulator 4 for demodulating the ternary phase shift keying modulated signal, which is output from the despreader 3, and outputting the demodulated signal as received information (a data signal). This transceiver structure constructs a spread-spectrum communication system that implements a CDMA communication system.

FIG. 2a to 2d are diagrams illustrating the structure and functions of ternary phase shift keying modulator for performing ternary phase shift keying modulation according to the present invention. As shown in FIG. 2a, the ternary phase shift keying modulator according to the present embodiment includes a data converting circuit 11, a control circuit 12, a parallel/serial converting circuit 13 and a ternary phase shift keying modulation circuit 14. As shown in FIG. 2a, three streams of binary ("0", "1") digital signals are supplied to the data converting circuit 11. In order to associate these input binary digital signals with three number of phase states (e.g., 0°, 120°, 240°), which can be assigned in a ternary phase shift keying modulation, the data converting circuit 11 receives at a time each combination of the "0", "1" bits of the three digital bit streams as an input of one symbol and converts the three signal streams to two signal streams, namely first and second signals composed of ternary values ("0", "1", "2") in symbol units. The control circuit 12 controls the conversion of the three streams of binary signals to the two streams of ternary signals in the data converting circuit 11. The parallel/serial converting circuit 13 adopts the eight state combinations of bits of the above-mentioned three streams of binary signals as two streams of ternary signals and converts these two signal streams to a serial signal (a time-division multiplexed signal). The serial signal is supplied to the ternary phase shift keying modulation circuit 14, which associates the ternary values of the serial signal with the three phase states of carrier signals on a per-symbol basis and outputs the resultant signal as a ternary phase shift keying-modulated signal. The specification of Japanese Patent Kokai Publication JP-A-4-196945 filed by the present inventor describes a general system for performing signal transmission other than $2^n$-valued QAM in the vicinity of one phase plane in a form in which a plurality of phase planes are correlated. Further, the specification of Japanese Patent Application No. 2001-246891 filed by the same inventor describes a method of constructing an ordinary 3×n-ary QAM, in which n represents a natural number, and the specification of Japanese Patent Application No. 2001-247360 filed by the same inventor describes a ternary phase shift keying modulation system.

Though the details of structure and operation of the ternary phase shift keying modulation circuit according to the embodiment set forth above are described in the specification of Japanese Patent Application No. 2001-247360, an overview of operation is given below.

In FIG. 2b illustrates an example of conversion in which binary signals in three streams are converted to ternary signals in two streams. Combinations (000 to 111) of binary signals in three streams are illustrated as the input to the control circuit 12, and combinations (00, 01, 02, 10, . . . 21) of ternary signals in two streams corresponding to respective ones of the above combinations are illustrated as the output of the control circuit 12. There are nine combinations of ternary values in the two signal streams with respect to eight combinations of binary values in the three signal streams. If each of the binary values of the three signal streams is uniquely assigned to one ternary value of the two signal streams, therefore, only one combination [e.g., "22" in the example of FIG. 2b] of unassigned ternary values of the two signal streams will occur.

In FIG. 2c is a diagram illustrating signal conversion of the ternary phase shift keying modulator 1 according to this embodiment. Entered binary signals (1) of three signal streams are converted by the data converting circuit 11 to ternary signals (2) of each of first and second signal streams indicative of ternary values. Values "0", "1", "2" of the ternary values are indicated by two signal lines each. The parallel/serial converting circuit 13 subjects each of the ternary value signals to time multiplexing, whereby the first and second signals are output by two signal lines each. Combinations of first and second signals output from the parallel/serial converting circuit 13 before and after in terms of time series correspond to symbol-by-symbol parallel data of the binary signals of the three input signal streams.

The output of the parallel/serial converting circuit 13 is supplied to the ternary phase shift keying modulation circuit 14. The latter associates the time-multiplexed first and second signals with any of the three phase states (three phases) [see FIG. 2d] to be modulated, and outputs the result as a ternary phase shift keying-modulated signal. More specifically, the ternary phase shift keying modulation circuit 14 assigns the three values "0", "1" and "2" to the phases 0°, 120° and 240° shown in FIG. 2d, thereby producing and outputting a ternary phase shift keying-modulated signal.

The ternary phase shift keying-modulated signal output from the ternary phase shift keying modulation circuit 14 of FIG. 2a is supplied to the spreader 2 shown in FIG. 1. The spreader 2 has a multiplier for multiplying the ternary phase shift keying-modulated signal by a spreading code, such as PN(pseudo noise) code or pseudo-random code, thereby spreading the spectrum of the ternary phase shift keying-modulated signal to obtain a broadband signal. This signal is output as one CDMA signal corresponding to the spreading code.

On the receive side according to the present embodiment, the despreader 3 and the ternary phase shift keying demodulator 4 demodulate the received information by functions and operations that are the inverse of those on the transmit side. More specifically, the spread-spectrum modulated received signal is supplied to the despreader 3 shown in FIG. 1. On the basis of the spreading code used on the transmit side, the despreader 3 despreads the received signal and outputs a ternary phase shift keying-modulated signal. Further, the ternary phase shift keying demodulator 4 has function circuits for implementing functions that are the inverse of those of the ternary phase shift keying modulator 1, namely a ternary phase shift keying demodulation circuit, serial/parallel converting circuit, data converting circuit and control circuit. The ternary phase shift keying demodulating circuit demodulates the output of the despreader 3 and outputs time-multiplexed first and second signals of ternary values. The serial/parallel converting circuit converts the time-multiplexed ternary signals to ternary signals of two signal streams, and the data converting circuit converts the ternary signals of the two signal streams to binary signals of three signal streams and outputs the result as received information.

According to the present embodiment, ternary phase shift keying modulation is utilized as primary modulation. As a result, the ratio Eb/No (referred to as "required Eb/No") of energy Eb per signal bit to noise-power spectrum density No, which ratio is a measure of performance for obtaining the required signal quality (namely signal quality indicative of a code error rate of, e.g., $1 \times 10^{-6}$), is superior to that for a case where QPSK is utilized. This will now be described.

First, let Eb [W·s/bit] represent energy per signal bit of a multi-phase modulated signal, and let R [bit/s] represent information transmission rate (the bit rate). Signal power C, therefore, will be represented by C=R×Eb. Further, let No [W/Hz] represent noise-power spectrum density, and let B [Hz] represent the signal transmission band. Noise power N [W], therefore, will be represented by N=B×No. Accordingly, the ratio C/N of signal power C to noise power N is expressed as follows:

$$C/N=(R \times Eb)/(B \times No)=(R/B) \times (Eb/No)$$

It is known that C/N (referred to as "required C/N") for obtaining the required signal quality (a code error rate or, e.g., $1 \times 10^{-6}$) of M-phase-shift keying increases by a factor of $1/[\sin(\pi/M)]^2$ (where M represents the number of phases in phase modulation), wherein the value of C/N in BPSK modulation is assumed to be 1.0 ("Principles of Data Communication", by R. Lucky et al., translated by Hoshiko et. al., Lattice Publications, 1973). Accordingly, with BPSK (Binary Phase-Shift Keying), TPSK(ternary phase shift keying), QPSK(Quaternary Phase-Shift Keying) and 8PSK (8-Phase-Shift Keying), the required C/N takes on values of 0 dB, 1.25 dB, 3.01 dB and 8.34 dB, respectively, in terms of relative values where BPSK is assumed to be 1 (0 dB).

Further, the number of transmission bits per symbol is LogM/Log2. Accordingly, the number of transmission bits per symbol becomes 1, 1.585, 2 and 3 with BPSK, TPSK, QPSK and 8PSK, respectively.

The required Eb/No $\{=[1/\sin^2(\pi/M)]/\text{Log}_2M\}$ in M-phase-shift keying modulation becomes 0 dB, −0.75 dB, 0 dB and 3.57 dB, in terms of relative values with respect to BPSK, with BPSK, TPSK, QPSK and 8PSK, respectively.

In a reference, by S. Noda, K. Nakamura and K. Koga, titled "Performance and Application of PSK modulation whose number of phases is not a power of 2," ISITA (International Symposium on Information Theory and Applications), pp239-242, Oct. 7-11, 2002, the BER performance of N-PSK(N is not a power of 2, called N2P-PSK) is evaluated and it is shown that N2P-PSK modulation enables more flexible trade-off between the bandwidth and Eb/No requirement by filling the gap of 2-,4-,and 8-PSK and leads to more efficient communication systems. It is reported in this reference that optimal mapping of conversion as shown in FIG. 2b was found for the case of 3 binary digit/2 ternary digit conversion.

FIG. 3 is a table showing the required C/N, number of transmission bits per symbol and values of required Eb/No (relative values with respect to BPSK) classified by number of phases in multiphase shift keying.

Figure 4:
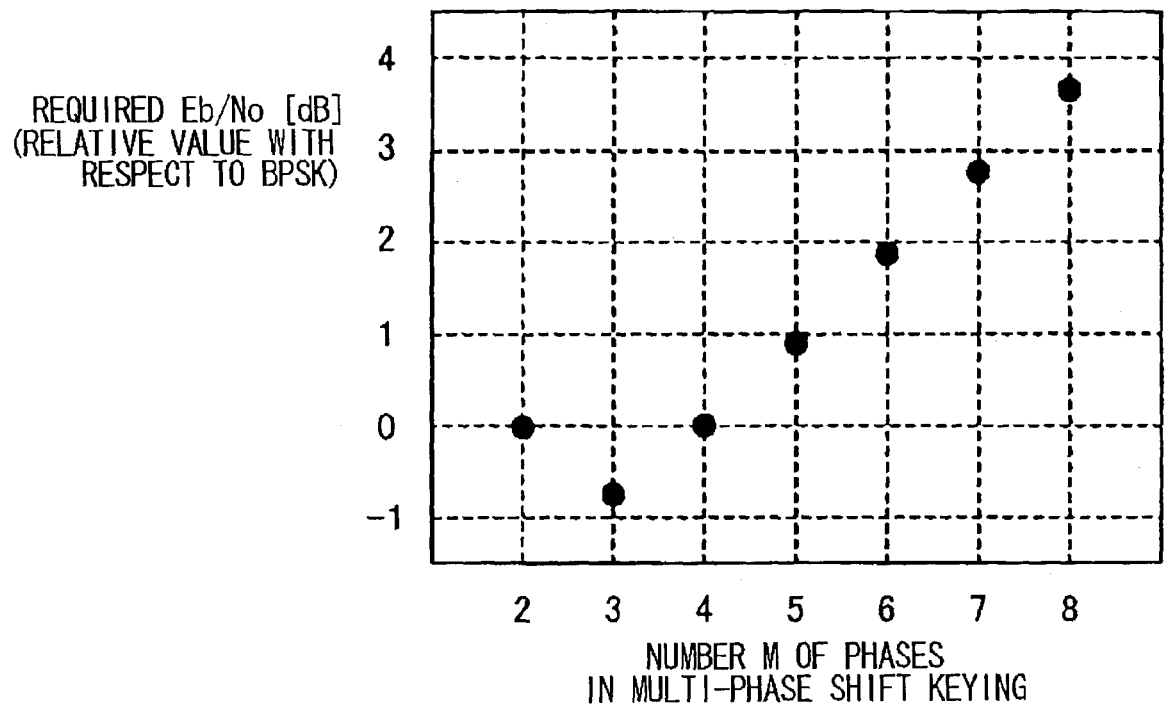
FIG. 4 is a graph showing a difference in necessary Eb/No in a case where various phase-shift keying is used.

FIG. 4 is a graph showing a difference in the required Eb/No in a case where various phase-shift keying is used. The number of phases in multi-phase shift keying is plotted along the horizontal axis in FIG. 4, and the required Eb/No is plotted along the vertical axis. It will be appreciated from the difference in Eb/No for each number of phases that the required Eb/No in the ternary phase shift keying system is the smallest.

Further, let L represent the number of user terminals that can be connected simultaneously. According to the publication titled "Spread-Spectrum Communications and Applications" by Marubayashi, Nakagawa and Kono, edited by the Electronics Information Communications Society, 1998, L is given by the following equation:

$$L=1+(W/R)/(Eb/No)$$

where R represents the information transmission rate, W the transmission band and Eb/No the ratio of energy Eb per bit to noise-power spectrum density No in the modulation system applied.

In accordance with this embodiment, therefore, the number of user terminals simultaneously connectable in a case where a ternary phase shift keying is applied to a CDMA communication system can be increased by about 0.75 dB, namely by about 19%.

Figure 5:
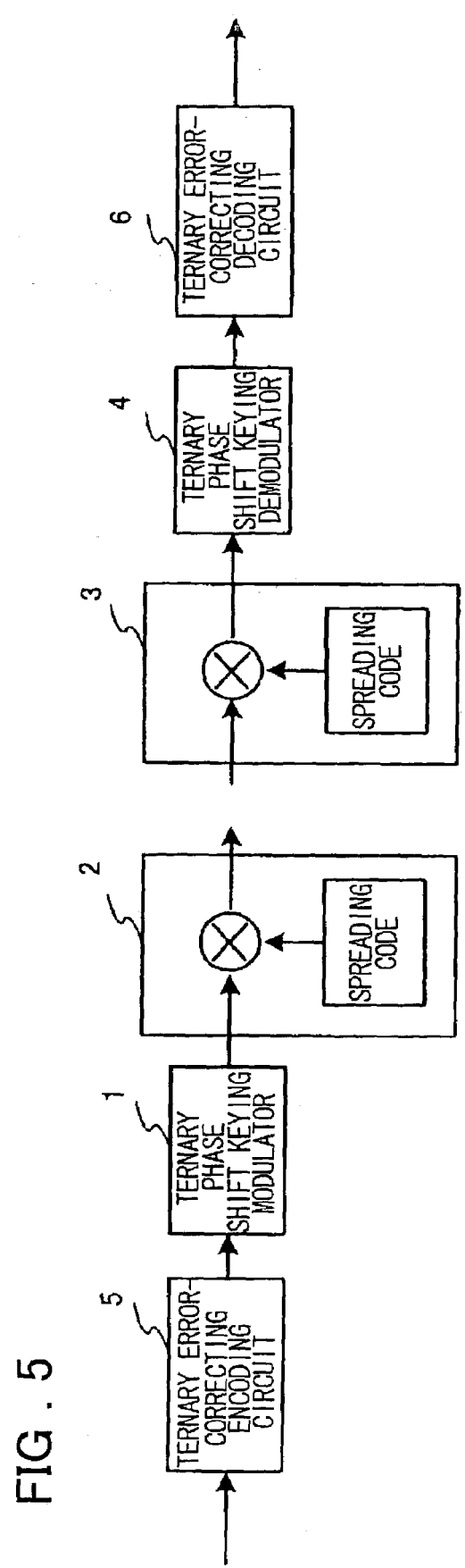
FIG. 5 is a block diagram illustrating another embodiment of the present invention.
Figure 6:
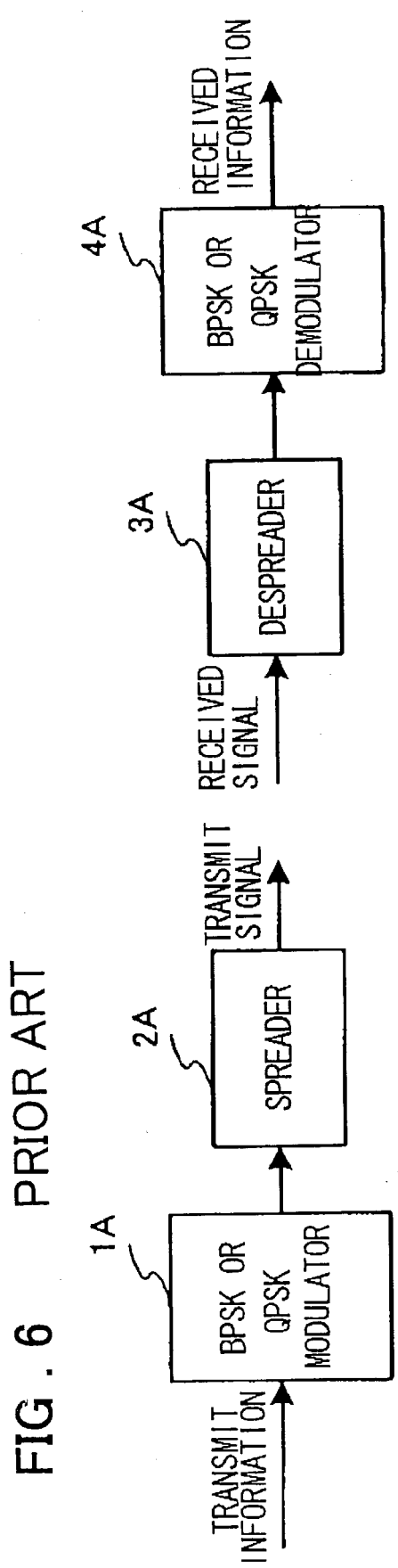
FIG. 6 is a diagram illustrating the structure of a modulator/demodulator in a CDMA communication system utilized in third-generation mobile communications according to the prior art.
Figure 7:
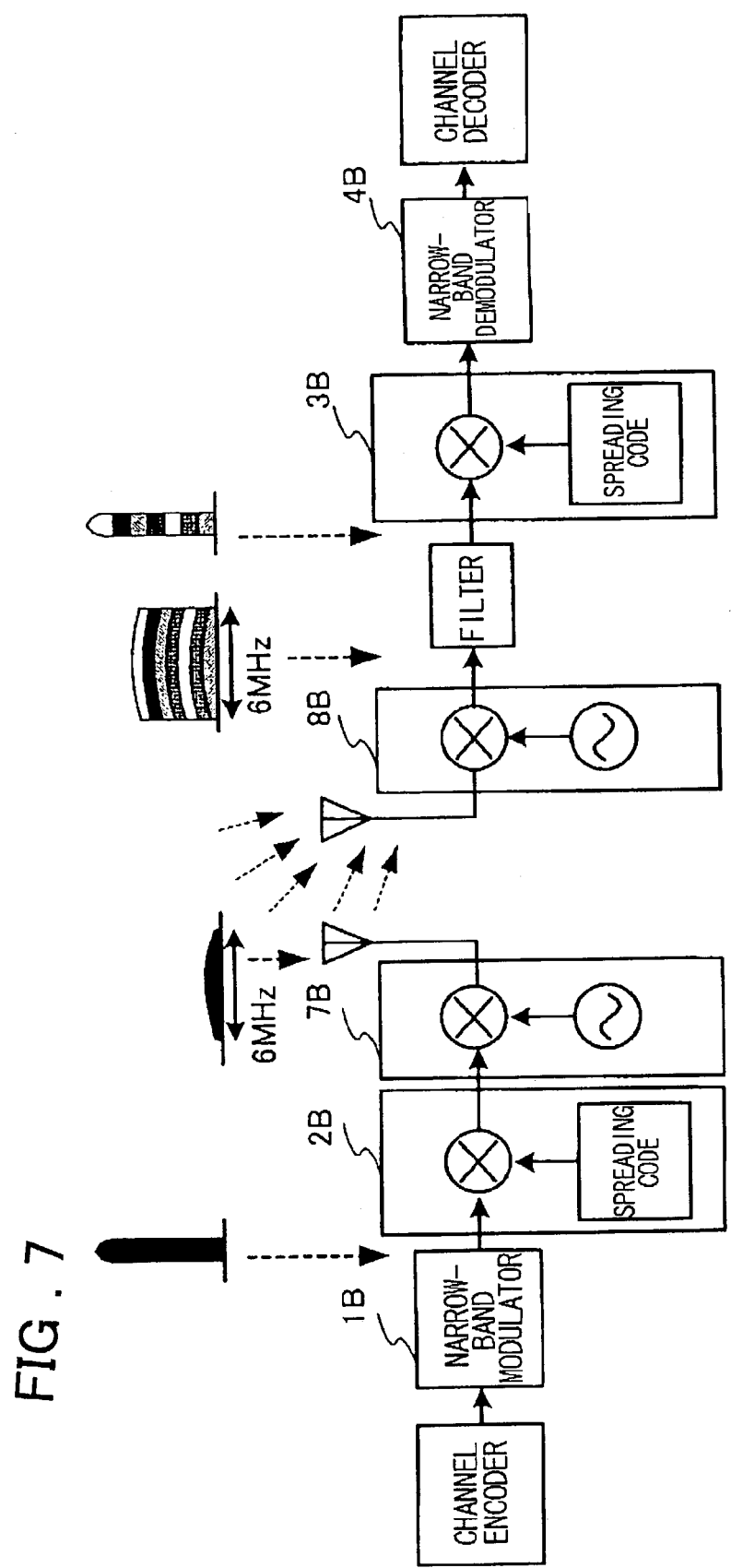
FIG. 7 is a diagram illustrating the principles of IMT-2000 DS-CDMA ["Simple IMT-2000" by Kota Kinoshita (published by the Electrical Communications Society, 2001)].

FIG. 5 is a block diagram illustrating another embodiment of the present invention. Though the basic structure is similar to that shown in FIG. 1, a ternary error-correcting encoding circuit 5 is provided at the input of the ternary phase shift keying modulator 1 and a ternary error-correcting decoding circuit 6 is provided at the output of the ternary phase shift keying demodulator 4, thereby applying ternary error-correcting encoding to transmit information. According to this embodiment, Eb/No can be improved by a further 2 to 3 dB by application of the ternary error-correcting coding, even in a case where simple encoding is applied, as in the manner of single error-correction BCH code. As a result, the number of user terminals that can be connected simultaneously can be doubled.

In each of the above embodiments, modulation in which the logic value and phase of data are made to correspond in one to one mapping is adopted as the ternary phase shift keying method. It is obvious, however, that any differential phase-shift keying (DPSK) method in which a change in amount of data is made to correspond to phase also can be applied.

The meritorious effects of the present invention are summarized as follows.

In accordance with the present invention, a ternary phase shift keying is applied as primary modulation in a CDMA communication system. As a result, in comparison with application of BPSK and QPSK modulation, it is possible to deliver far better performance in the Eb/No ratio in order to obtain the required signal quality. For example, in a case where a signal quality in which the code error rate is $1 \times 10^{-6}$ is obtained, the invention delivers a performance in which Eb/No is improved by about 0.75 dB.

In accordance with the present invention, therefore, it is possible to increase greatly the number of user terminals that can be connected simultaneously. In particular, it is possible to improve Eb/No by about 0.75 dB, namely by about 19%, as illustrated the above-described example. When the number of simultaneously connected terminals is sufficiently large, the number L of simultaneously connectable user terminals can be increased by about 19% in comparison with a case where BPSK and QPSK are applied. Furthermore, by applying ternary error correcting encoding, it is possible to accommodate nearly twice the number of simultaneously connected terminals.

With the code division multiple access communication system according to the present invention, the number of user terminals that can be connected simultaneously can be increased a little less than 20% in comparison with the conventional system that applies BPSK and QPSK. As a result, a greater number of user terminals can be accommodated by the investment required for a single base station facility. This has major advantages both for the user and the communications provider.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A code division multiple access communication system comprising:
    a primary modulation unit; and
    a secondary modulation unit,
    wherein the primary modulation unit performs ternary phase-shift keying modulation as primary modulation of a carrier signal by a data signal, said primary modulation unit comprising:
        data converting means, receiving three signal streams of input binary signals, for converting the three signal streams to two signal streams comprising first and second ternary signals;
        parallel/serial converting means, receiving the two signal steams output from the data converting circuit, for converting the two signal streams to time multiplexed serial ternary signals; and
        a ternary phase shift keying modulator, and
    wherein the secondary modulation unit receives an output from said primary modulation unit.

2. The system according to claim 1, further comprising a unit for applying ternary error-correcting encoding to the data signal.

3. A modulating apparatus for use in a code division multiple access communication system, said modulating apparatus comprising:
    a ternary phase-shift keying modulator for modulating a data signal, said keying modulator comprising:
        a data converting circuit which receives three signal streams of input binary signals, and converts the three signal streams to two signal streams including first and second ternary signals;
        a parallel/serial converting circuit which receives the two signal streams output from the data converting circuit and converts the two signal streams to time multiplexed serial ternary signals; and
        a ternary phase shift keying modulation circuit; and
    a spreader for performing spectrum-spreading of an output signal of the ternary phase-shift keying modulator with a spreading code.

4. The apparatus according to claim 3, further comprising a ternary error-correcting encoding circuit for applying ternary error-correcting encoding to the data signal.

5. A modulating apparatus according to claim 3, wherein said ternary phase shift keying modulation circuit receives the serial ternary signal output from the parallel/serial converting circuit and executes ternary phase shift keying modulation of a carrier signal by associating the serial ternary signal value with three phase states of the carrier signal on a per-symbol basis to output a result as a ternary phase shift keying-modulated signal.

6. A communication method for use in a code division multiple access communication system, said method comprising using ternary phase-shift keying modulation as primary modulation of a carrier signal by a data signal, said using said ternary phase-shift keying modulation comprising:

receiving three signal streams of input binary signals;

converting the three signal streams to two signal streams including first and second ternary signals;

converting the two signal streams to time multiplexed serial ternary signals; and executing ternary phase shift keying modulation of a carrier signal by associating the serial ternary signal value with three phase states of the carrier signal on a per-symbol basis to output a result.

7. The method according to claim 6, further comprising a step of applying ternary error-correcting encoding to the data signal.

8. A spread-spectrum communication system comprising at least a unit for performing ternary phase-shift keying modulation as primary modulation of a carrier signal by a data signal, said keying modulation unit comprising:

a data converting circuit that receives three signal streams of input binary signals, and converts the three signal streams to two signal streams including first and second ternary signals;

a parallel/serial converting circuit that receives the two signal streams output from the data converting circuit and converts the two signal streams to time multiplexed serial ternary signals; and a ternary phase shift keying modulation circuit.

9. The system according to claim 8, further comprising means for applying ternary error-correcting encoding to the data signal.

10. A demodulating apparatus for use in a code division multiple access communication system, said demodulating apparatus comprising:

a despreader for performing spectrum-despreading of a received signal with a spreading code; and a ternary phase-shift keying demodulator for demodulating an output signal of the despreader to output a demodulated data signal of binary signals of three signal streams, wherein the ternary phase-shift keying demodulator comprises:

a ternary phase shift keying demodulation circuit receiving the output signal of the despreader and demodulating the signal by associating three phase states of the modulated signal with ternary values of the signal on a per-symbol basis to output serially a demodulated ternary signal;

a serial/parallel converting circuit receiving the ternary signal output serially from the ternary phase shift keying demodulation circuit and converting the two number of serial ternary signals to two streams of ternary signals; and a data converting circuit receiving the two streams of ternary signals output from the serial/parallel converting circuit and converting the two streams of ternary signals to three streams of binary signals to output three streams of binary signals as received information.

* * * * *